United States Patent
Karnaushenko et al.

(10) Patent No.: US 11,208,321 B2
(45) Date of Patent: Dec. 28, 2021

(54) THREE-DIMENSIONAL MICRO DEVICES AND METHOD FOR THEIR PRODUCTION

(71) Applicant: LEIBNIZ-INSTITUT FUER FESTKOERPER-UND WERKSTOFFFORSCHUNG DRESDEN E.V, Dresden (DE)

(72) Inventors: Daniil Karnaushenko, Dresden (DE); Dmitriy Karnaushenko, Dresden (DE); Oliver G. Schmidt, Dresden (DE)

(73) Assignee: LEIBNIZ-INSTITUT FUER FESTKOERPER-UND WERKSTOFFFORSCHUNG DRESDEN E.V., Dresden (DE)

( * ) Notice: Subject to any disclaimer, the term of this patent is extended or adjusted under 35 U.S.C. 154(b) by 398 days.

(21) Appl. No.: 16/107,431

(22) Filed: Aug. 21, 2018

(65) Prior Publication Data
US 2019/0062154 A1    Feb. 28, 2019

(30) Foreign Application Priority Data

Aug. 22, 2017 (DE) .......... 102017214638.9

(51) Int. Cl.
*B81C 1/00*    (2006.01)
*B81C 3/00*    (2006.01)
(Continued)

(52) U.S. Cl.
CPC ........ *B81C 1/00198* (2013.01); *B81B 3/0078* (2013.01); *B81B 5/00* (2013.01);
(Continued)

(58) Field of Classification Search
CPC ... B81B 3/0078; B81B 5/00; B81B 2201/034; B81B 2201/038; B81B 2203/06;
(Continued)

(56) References Cited

U.S. PATENT DOCUMENTS 6,229,684 B1 * 5/2001 Cowen .................. F03G 7/06
361/277
6,236,491 B1 * 5/2001 Goodwin-Johansson ..................
G02B 6/357
359/291
(Continued)

FOREIGN PATENT DOCUMENTS

DE     102006015492 A1 * 10/2007
DE     10-2008 040 472.1   *  9/2009
EP            2023357         2/2009

OTHER PUBLICATIONS

3D Patterned Self-Assembling, Untethered Microdevices PhD disereta-tion by Timothy Ga=Ming Leong Jihn Hopkins Univ., Oct. 2008.*
(Continued)

*Primary Examiner* — Carl J Arbes
(74) *Attorney, Agent, or Firm* — Greenblum & Bernstein, P.L.C.

(57) ABSTRACT

Three-dimensional micro devices usable as electromagnetic and magnetomechanical energy converters, as micromag-netic motors or generators, and methods for their production. The three-dimensional micro devices exhibit high efficiency even at dimensions on the microscale and below, and the method for production, as well as mass production, is simple and economical. Moreover, the three-dimensional micro devices at least include one three-dimensional device pro-duced using roll-up technology. This three-dimensional device includes all functional and structural components for full functionality. At least one functional or structural com-ponent is an element that is at least partially freely movable at least partially within a surrounding element and is arranged such that it can be rotated at least around one of its axes.

21 Claims, 1 Drawing Sheet

Figure 1:
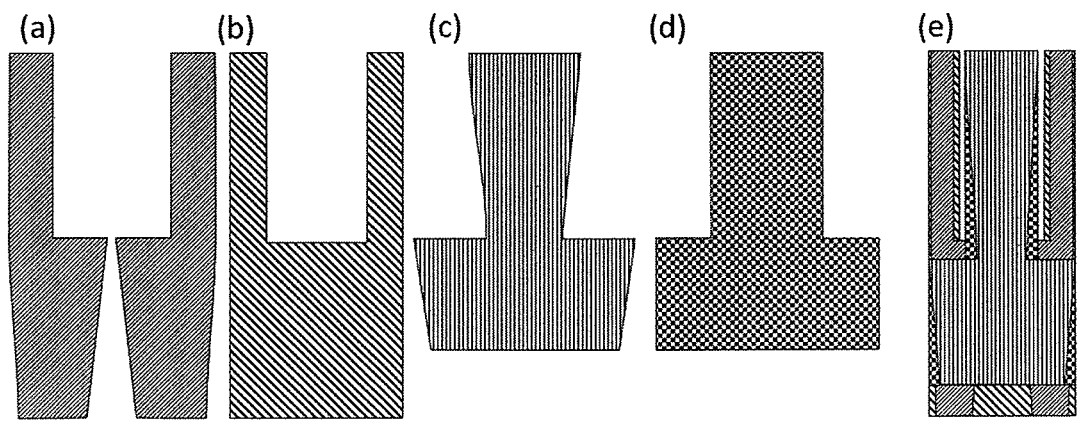

(51) Int. Cl.
*B81B 3/00* (2006.01)
*B81B 5/00* (2006.01)

(52) U.S. Cl.
CPC ........ *B81C 1/0019* (2013.01); *B81C 1/00341* (2013.01); *B81C 3/001* (2013.01); *B81B 2201/034* (2013.01); *B81B 2201/038* (2013.01); *B81B 2203/06* (2013.01); *B81C 2203/032* (2013.01); *B81C 2203/0757* (2013.01)

(58) Field of Classification Search
CPC ... B81C 3/001; B81C 1/0019; B81C 1/00341; B81C 1/00198; B81C 2203/032; B81C 2203/0757
See application file for complete search history.

(56) References Cited

U.S. PATENT DOCUMENTS

| | | | | |
|---|---|---|---|---|
| 6,275,325 | B1* | 8/2001 | Sinclair | B81B 3/0024 359/290 |
| 6,287,391 | B1* | 9/2001 | Kanekiyo | H01F 1/0571 148/101 |
| 6,456,420 | B1* | 9/2002 | Goodwin-Johansson | B81B 3/0018 333/246 |
| 8,136,213 | B2* | 3/2012 | Schmidt | H01G 4/30 29/25.42 |
| 8,861,184 | B2 | 10/2014 | Schmidt | |
| 9,266,311 | B2* | 2/2016 | Yamashita | B82Y 25/00 |
| 2005/0118733 | A1* | 6/2005 | Schmidt | H01F 17/0006 438/3 |
| 2008/0218934 | A1* | 9/2008 | Langereis | B01L 3/502738 361/283.1 |
| 2010/0043206 | A1* | 2/2010 | Yamashita | H02K 1/02 29/598 |

OTHER PUBLICATIONS

Polyimide Film Based RF MEMS Capacitive Switches by R. Ramadoss et al Proc. IEEE MTT-S Int, Microwave Symp. Dig., Seattle, Wash. Jun. 2-7, 2002.*

Fabrication Assembly, and Testing of RF MEMS Capacitive Switches Using Flexible Printed Circuit Technology, by R. Ramadoss et al, IEEE Trans.on Advanced Packaging, vol. 26, No. 3, Aug. 2003.*

Coin-size coiled-up polymer foil thermoelectric power generator for wearable electronics</i> by Weber et al Sensors ANS Actuators A—Physical 132.1; 325-330 Elsevier Science SA (Nov. 8, 2006.).*

Thin=Film PZT-based Transducers (Chapter 4 ) by Kurosawa (pp. 117-153 Ultrasinic Transducers) 2012.*

An ultrasonic micromotor using a bernding cylinder transducer based on {ZT thin film</i> by Morita et al I in Sensors and Actuatiors A50 ( </i>1995) 75-80.*

Cavallo, et al: Applied Physics Letters, vol. 93, No. 14, p. 143113-143113-3, Oct. 2008.

Mendach, et al: Physica E: Low-dimensional Systems and Nanostructures, vol. 23, No. 3-4, p. 274-279, Jul. 2004.

Bleuler et al., Automatica vol. 30 No. 5, p. 871-876.

Yi et al., Proceedings of the 34$^{th}$ Conference on Decision and Control, New Orleans 1995.

Nerguizian et al., European Micro and Nano Systems, EMN 2004, Paris ISBN:2-84813-031-7.

Schweitzer, G. et al.: Magnetic Bearings. Theory, Design and Application to Rotating Machinery. Springer, Berlin, 2009.

* cited by examiner

THREE-DIMENSIONAL MICRO DEVICES AND METHOD FOR THEIR PRODUCTION

CROSS-REFERENCE TO RELATED APPLICATION

This application claims priority under 35 U.S.C. § 119(a) of German Application No. 10 2017 214 638.9 filed Aug. 22, 2017, the disclosure of which is expressly incorporated by reference herein in its entirety.

The invention pertains to the fields of electrical engineering, materials engineering and mechanical engineering and relates to three-dimensional micro devices which can be used as electromagnetic and magnetomechanical energy converters, as micromagnetic motors or generators, and to a method for their production.

Numerous electromagnetic machines are used in everyday life and in industrial production. Their efficiency is nearly 100%. The motors used thereby exhibit great diversity and are based on various functional principles, and are thus for example induction motors, synchronous motors or alternating current motors with permanent magnets, alternating current machines or direct current machines. With motors of this type, electrical power/forces are to be converted into mechanical power/forces with the highest possible efficiency, regardless of their size and shape. However, particularly the miniaturization of motors or generators of this type is difficult because the torque of these electromagnetic machines is markedly reduced by the reduction in the dimensions, and the efficiency of the machines therefore decreases significantly. Where dimensions are smaller than the mm scale, the efficiency is so low that use is unprofitable and the production of the machines is considerably more expensive. In addition, the production of various individual components, such as sliding contacts, magnets, electrodes, etc., on a scale miniaturized to such an extent remains very difficult, and is therefore too costly for mass production.

The independent rolling-up of strained thin-layer capacitors when these capacitors are detached from a substrate is known according to EP 2 023 357 B1.

Likewise, the production of rolled resistors (F. Cavallo, et al: Applied Physics Letters, Vol. 93, No. 14, p. 143113-143113-3, Oct. 2008) or the production of wound thermoelectric components (DE 10 2008 040 472 A1) are known.

According to S. Mendach, et al: Physica E: Low-dimensional Systems and Nanostructures, Vol. 23, No. 3-4, p. 274-279, July 2004, the production of curved two-dimensional electronic systems in InGaAs/GaAs microtubes is known.

For measuring the maximum air gap induction present in electric machines or magnetic bearings, rigid non-deformable sensors are known which utilize the Hall effect. Particularly important for these applications is the sensor thickness, which is minimally 250 µm plus 150 µm for fitting into a gap in order to detect signals.

Furthermore, various studies for the use of rigid Hall sensors in rotating (Bleuler et al., Automatica Vol. 30 No. 5, p. 871-876) and non-rotating (Yi et al., Proceedings of the 34th Conference on Decision and Control, New Orleans 1995) applications are known.

For the flux-based closed loop control of asynchronous motors, the use of micro electromechanical systems (MEMS) was also proposed (Nerguizian et al., European Micro and Nano Systems, EMN 2004, Paris ISBN: 2-84813-037-7).

However, these MEMS are not in widespread use, since their efficiency is still too low, their geometry cannot yet be adapted to the desired requirements, and since they also do not yet function in a trouble-free manner. In particular, the motive power, which is still too small, is hindering their use.

Other MEMS are based, for example, on piezoelectric actuators with dimensions under 1 mm (10.1109/JMEMS.2004.828736). However, a further miniaturization of these MEMS is also limited as a result of the physical properties of these MEMSs, which properties are altered with the miniaturization, and their production becomes considerably more difficult or is not possible.

The disadvantage of these known solutions is that the efficiency of the electromechanical machines decreases markedly with the reduction of the dimensions, and that the production methods become significantly more costly and elaborate as the dimensions are reduced.

Furthermore, the measurement of the air gap induction using sensor coils is known, which coils are wound around the pole of the magnetic bearing stator or around the stator tooth of an electric machine (Schweitzer, G. et al.: Magnetic Bearings. Theory, Design and Application to Rotating Machinery. Springer, Berlin, 2009).

The object of the present solution is to specify three-dimensional micro devices that exhibit high efficiency even at dimensions on the microscale and below, and a simple and economical method for their production, as well as for mass production.

The object is attained with the features recited in the patent claims, wherein the invention also includes combinations of the individual dependent patent claims within the meaning of a logical AND operation, provided that they are not mutually exclusive.

The three-dimensional micro devices according to the invention are at least composed of one three-dimensional device produced using roll-up technology, which device comprises all functional and structural components for full functionality, wherein at least one functional or structural component is an element that is at least partially freely movable at least partially within a surrounding element and is arranged such that it can be rotated at least around one of its axes.

Advantageously, the functional and structural components are present for motors, generators, sensors, in particular magnetic sensors that utilize the effects of MR, GMR, TMR and/or Hall effects, spin effects or induction; for pumps, diodes, capacitors, resistors, piezo devices; optical devices such as lenses, waveguides, gratings; and/or turbines, transistors and/or actuators, in prosthetic devices, and/or in microfluidics.

Also advantageously, rotors, stators, windings, electrical and/or electronic elements, electrical contacts are present as functional components.

Likewise advantageously, the functional and/or structural components are composed entirely or partially of metallic materials such as copper, gold and/or magnetic materials and/or semiconductor materials and/or polymer materials and/or insulator materials, wherein more advantageously a ferromagnetic or ferrimagnetic or paramagnetic material that is Co, Fe, Nd, Ni, or Co-, Fe-, Nd- or Ni-based alloys, or is made of alloys of these materials, is present as magnetic material.

And also advantageously, the devices are structurally composed of a planar multilayer system.

It is also advantageous if, for a motor or generator or sensor or actuator, at least one rotor is present such that it is freely movable in a stator, and furthermore if all other functional and structural components for full functionality as a motor or generator are present.

It is likewise advantageous if the devices are positioned in a fixed manner on a substrate, advantageously on the substrate on which they were produced.

It is also advantageous if the devices have at least one outer dimension that is less than or equal to 0.5 mm, advantageously less than or equal to 0.1 mm, more advantageously on the sub-micrometer scale less than or equal to 200 µm, advantageously less than or equal to 1 µm.

In the method according to the invention for the production of micro devices, at least one three-dimensional micro device is produced on a substrate using roll-up technology, wherein the at least one three-dimensional micro device is completely produced with all functional and structural components within the overall process and is fully functional following production, and wherein for the three-dimensional micro device at least one element that is at least partially freely movable partially within a surrounding element is produced using roll-up technology, with the at least one element being produced such that it can be rotated at least around one of its axes.

Advantageously, a plurality of identical and/or different three-dimensional micro devices is produced simultaneously on a substrate.

Also advantageously, for the individual three-dimensional micro devices, at least one sacrificial layer is applied on a substrate, and multiple identically or differently composed and structured layer systems are applied on said layer, and the individually applied layer systems are rolled up into multilayer systems by the partial or complete removal of the sacrificial layer or sacrificial layers.

Likewise advantageously, for the production of a motor or generator or sensor or actuator, a layer system is applied on a substrate with at least one sacrificial layer, in which layer system the layers for the at least partially surrounded functional and structural components are rolled up first and the layers for the at least partially surrounding functional and structural components are then rolled up.

And also advantageously, for the production of fully freely movable elements at least partially within a surrounding element, at least one additional sacrificial layer is applied, and the layer system for the freely movable element applied thereon, after the layer system for the production of the surrounding element, wherein more advantageously at least one layer is applied in a strained manner in place of a sacrificial layer or under or on top of a sacrificial layer, wherein for a layer stack a strain gradient is created across the height of the layer stack, and the strain is released in order to roll up the layer stacks, or the at least one layer is strained for the rolling-up, wherein also more advantageously a hydrogel or a polymer layer is applied as this one layer.

With the solution according to the invention, it is for the first time possible to specify three-dimensional micro devices that exhibit high efficiency even at dimensions on the microscale and below, and micro devices of this type can for the first time be produced using a simple and economical method, even in mass production.

This is achieved by three-dimensional micro devices that have been produced using roll-up technology and are therefore three-dimensional devices.

According to the invention, roll-up technology is to be understood as a method in which layers are applied on a substrate, which layers then roll up on their own during a controlled detachment from the substrate. The mechanism of the independent rolling-up is achieved, for example, by an application of the layers in a strained state and a subsequent mechanical release, by detaching the layers from the substrate or by removing a sacrificial layer or by straining a layer.

According to the solution specified by the invention, it is of particular importance that the three-dimensional micro devices comprise all functional and structural components for full functionality.

It is also particularly important according to the invention that, for the three-dimensional micro device, at least one functional or structural component is present which is an element that is at least partially freely movable at least partially within a surrounding element and is arranged such that it can be rotated at least around one of its axes.

This means that, after their production in an overall production process, the three-dimensional micro devices according to the invention comprise all the functional and structural components necessary for the respective function.

According to the invention, functional and structural components of this type are advantageously present for motors, generators, sensors, in particular magnetic sensors that utilize the effects of MR, GMR, TMR and/or Hall effects, spin effects or induction; for pumps, diodes, capacitors, resistors, piezo devices; optical devices such as lenses, waveguides, gratings; and/or turbines, transistors and/or actuators, in prosthetic devices, and/or in microfluidics.

Rotors, stators, windings, electrical and/or electronic elements, electrical contacts can thereby also advantageously be present as functional components.

The functional and/or structural components can advantageously be composed entirely or partially of metallic materials such as copper, gold and/or magnetic materials and/or semiconductor materials and/or polymer materials and/or insulator materials.

Organic and inorganic polymers such as polyimides, polyethylenes, parylenes can, for example, be used as polymer materials.

Also, the functional and/or structural components can advantageously be composed of magnetic materials such as ferromagnetic or ferrimagnetic or paramagnetic materials, such as Co, Fe, Nd, Ni, or Co-, Fe-, Nd- or Ni-based alloys, or alloys of these materials.

In the solution according to the invention, the three-dimensional micro devices are thereby structurally composed of a planar multilayer system.

This means that a system of layers is applied on a substrate in a structured manner, which layers then roll up in a desired way and subsequently form a three-dimensional micro device according to the invention. It is thereby particularly important that all functional and structural components of the desired three-dimensional micro device according to the invention are produced in a single overall production process.

In the event that the three-dimensional micro device according to the invention is a motor or generator or sensor or actuator having at least one freely movable rotor in a stator that at least partially surrounds the rotor, all components for the production of all other functional and structural components for full functionality as a motor or generator or sensor or actuator are applied as layer systems on a substrate and rolled up, and are then fully usable as a finished device.

The three-dimensional micro devices according to the invention can thereby be positioned in a fixed manner on a substrate, advantageously on the substrate on which they were produced, or can be detached from the substrate on which they were produced and placed in a desired position on another substrate.

The three-dimensional micro devices according to the invention thereby advantageously have at least one outer dimension that is less than or equal to 0.5 mm, advantageously less than or equal to 0.1 mm, more advantageously on the sub-micrometer scale less than or equal to 200 μm, advantageously less than or equal to 1 μm.

The three-dimensional micro devices are produced according to the invention in that at least one three-dimensional micro device of this type is produced on a substrate using roll-up technology.

It is thereby particularly advantageous for the solution according to the invention that a plurality of identical and/or different three-dimensional micro devices is simultaneously produced on a substrate.

It is particularly important according to the invention that the at least one three-dimensional micro device is completely produced with all functional and structural components within the overall process, and that it is fully functional following production.

The three-dimensional micro devices according to the invention thereby comprise at least one element that is at least partially freely movable partially within a surrounding element and is produced using roll-up technology, and is produced such that it can be rotated at least around one of its axes.

According to the invention, at least one sacrificial layer is thereby advantageously applied on a substrate, and multiple identically or differently composed and structured layer systems are applied on said layer, and the individually applied layer systems roll up independently as a result of the partial or complete removal of the sacrificial layer.

This can be achieved with particular effectiveness if the layers have been applied on the sacrificial layer in a strained manner, wherein for a layer stack, a strain gradient can also be created across the height of the layer stack.

The rolling-up can be triggered by a release of the strain.

At least one additional layer can also be applied on the substrate on top of and/or under a sacrificial layer, which additional layer is strained in order to trigger the rolling-up. A hydrogel or a polymer layer can be applied as an additional layer of this type.

Within the scope of the present invention, sacrificial layer is to be understood as a layer which is partially or completely removed from the substrate and/or the rolled-up layer stack and/or is modified in such a way that this modification causes the rolling-up of the layer stack. The modification can, for example, be achieved by changing the temperature or pressure or by initiating a chemical reaction.

If a motor or generator or sensor or actuator is produced as a three-dimensional micro device according to the invention, a layer system is applied on a substrate with at least one sacrificial layer, in which layer system the layers for the at least partially surrounded functional and structural components are rolled up first and the layers for the at least partially surrounding functional and structural components are then rolled up.

One or more additional layers for triggering the rolling-up can also be applied as a sacrificial layer.

According to the invention, in particular for the production of fully freely movable elements at least partially within a surrounding element, at least one additional sacrificial layer or other layer is applied, and the layer system for the freely movable element applied thereon, after the layer system for the production of the surrounding element. Only then is the layer system for the fully freely movable element rolled up, and after that the layer system for the surrounding element, so that the rotor is arranged inside of a stator, for example, after the rolling-up.

Likewise advantageously, the three-dimensional micro devices are produced according to the invention such that they are positioned in a fixed manner on a substrate.

This results in a significant improvement in the efficiency of the production method and, at the same time, in a simplification of the positioning of the desired three-dimensional micro devices on a substrate for subsequent use.

A particularly advantageous embodiment of the invention is the specification and production of three-dimensional micro devices composed of multiple functional and structural components which can be freely movable and must not be materially connected to one another for their function, as in the case of a rotor and stator in a motor or generator with rotational or linear movement, for example. In order to produce a three-dimensional micro device of this type, the rolling-up can, according to the invention, be performed by two layer stacks or layers in opposite directions.

Through the use according to the invention of roll-up technology for the production of the three-dimensional micro devices according to the invention, at least one axis each of the surrounding element and the freely movable element located therein is always arranged essentially parallel to the surface of the substrate.

The freely movable element of the three-dimensional micro device according to the invention within the surrounding element is thereby arranged according to the invention such that it can be rotated, and can be arranged such that it is also or even only linearly movable.

In the case of a rotor/stator array as a three-dimensional micro device according to the invention, during production the rotational axis of the rotor, which is also the axis of the stator, is advantageously arranged parallel to the substrate surface so that the rotor is arranged such that it can be rotated in the stator and is at the same time also linearly movable.

The production of a three-dimensional micro device composed of multiple components according to the invention is, precisely according to the invention, possible in one overall production process without additional work steps, wherein all electrical or media connections are also fully present following production, and the functionality of the three-dimensional micro device is thus fully available immediately following the production process.

It is thereby particularly advantageous if the production of the three-dimensional micro devices takes place on the same substrate on which the subsequent use is to occur, since the three-dimensional micro device is then created exactly in the future position on the substrate with the connection of all electrical and media connections.

The production method according to the invention is thus particularly suitable for the mass production of identical and/or different three-dimensional micro devices in an overall process and, advantageously, directly in the position of subsequent use.

The invention is explained in greater detail below with the aid of multiple exemplary embodiments.

Figure 2:
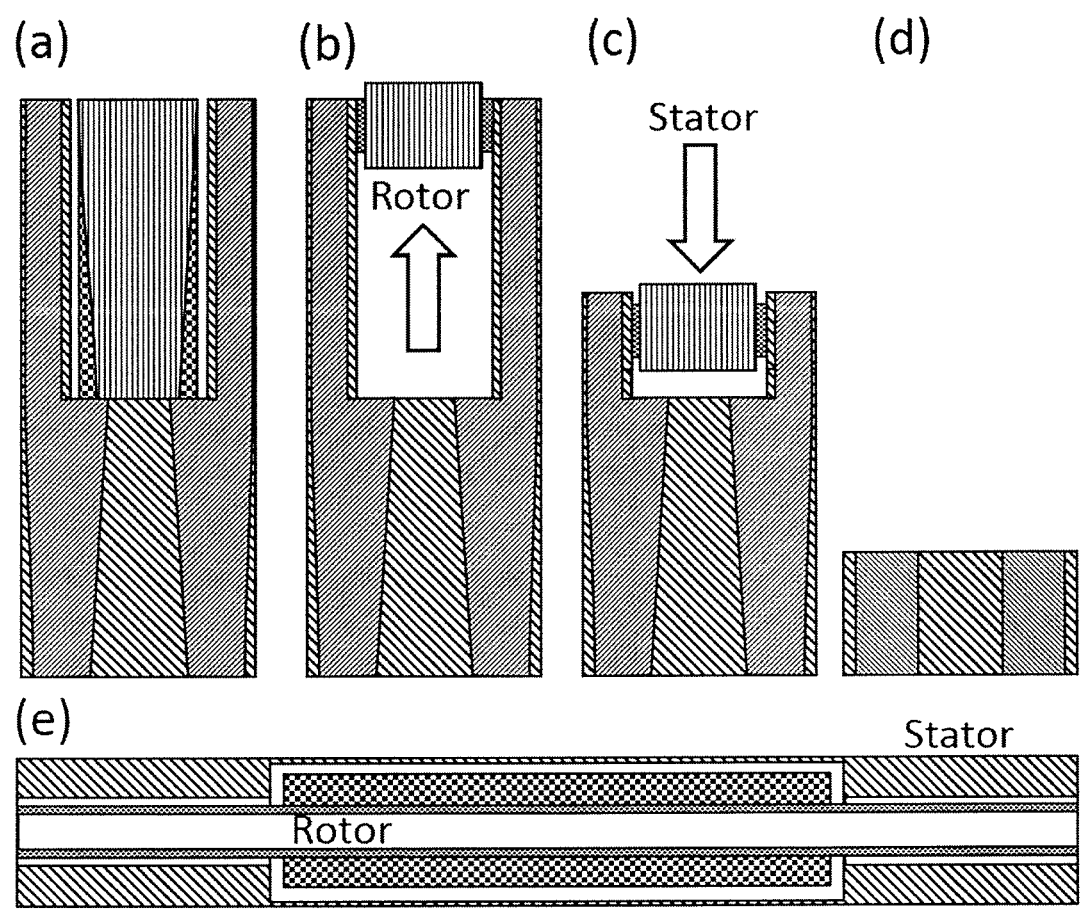

Wherein:

FIG. 1 shows the layout for the layers of a stator according to the invention for a motor with (a) a hydrogel layer of the stator, (b) a polyimide layer of the stator, (c) a hydrogel layer of the rotor, (d) a polyimide layer of the rotor, (e) a layer stack, as viewed from the substrate side; the sacrificial layers are not illustrated;

FIG. 2 shows a basic illustration of the method sequence for the production according to the invention of a micro motor as a three-dimensional micro device according to the invention, with
- (a) the illustration of the initial structure of the layer stack,
- (b) the illustration of the rolled-up rotor on the stator layers,
- (c) the illustration of the rolling-up of the stator layer (50% complete),
- (d) the illustration of the rolled-up stator,
- (e) the view of the cross section of the micro motor with a rotor and stator that were produced using roll-up technology.

EXAMPLE 1

A substrate of silicon dioxide with the dimensions of 100×100 mm$^2$ and a thickness of 1 mm is repeatedly rinsed in a dishwasher with surfactants (anionic and ionic) and DI water for 1 h 30 min.

On the substrate surface, a monolayer of 3-(trimethoxysilyl)propyl methacrylate (Polysciences Europe GmbH) is applied as an adhesive layer over the entire surface, in that the substrates are left for a total of 3 h under vacuum at 150° C. with the vapor from the silane molecules and water.

i) On this adhesive layer, a layer of acrylic acid (AA) (Alfa Aesar) and hydrated La$^{3+}$ (Alfa Aesar) is applied as a sacrificial layer over the entire surface. For this purpose, a mixture of 30 g AA and 15 g LaCl$_3$ in water is produced, which mixture results in a precipitate of LaAA at an increased solution pH of 10. This precipitate is collected through filter paper in a desiccator, where this precipitate is dried for 10 h at 40° C. Next, the material obtained is dissolved in AA and, at a concentration of 25 wt %, photosensitized with 2 wt % 2-benzyl-2-(dimethylamino)-4'-morpholinobutyrophenone and 3 wt % methyldiethanolamine (Sigma-Aldrich Co. LLC, Germany). From this sacrificial layer solution, a 200-nm thick layer is produced by means of spin coating at 3500 rpm for 35 s. Drying is carried out at 60° C. for 5 min, and the structuring then occurs by means of a treatment with a 405-nm mercury h-line (20 mW/cm$^2$) for 3 min through a glass/Cr mask with the use of a SUSS MA45 (Karl Suss KG—GmbH & Co., Munich-Garching, Germany) mask aligner. Development takes place in DI water for 15 s with a subsequent rinsing in 1-methoxy-2-propyl acetate (Sigma-Aldrich Co. LLC, Germany). Finally, the samples are annealed at 220° C. for 5 min under a nitrogen atmosphere in order to remove all residual solvent and to stabilize the layer.

ii) On the adhesive layer, a polymeric swelling layer is applied in a shape according to FIG. 1 (a), which layer is produced from a reaction of N-(2-hydroxyethyl)acrylamide (HEAA) and poly(ethylene-alt-maleic anhydride) (PEMA) in N,N-dimethylacetamide (DMAc), wherein a 2 wt % 2-benzyl-2-(dimethylamino)-4'-morpholinobutyrophenone (Sigma-Aldrich Co. LLC, Germany) is dissolved in DMAc. 6 g PEMA is dissolved in 50 ml DMAc and 5.8 g HEAA is added. The reaction takes place for 10 h at room temperature. Using spin-coating, this solution is applied to the sacrificial layer at 4000-8000 rpm. The thickness of the resulting swelling layer is 1000-300 nm. After the polymeric swelling layer is dried at 60° C. for 5 min, the layer stack is exposed on the substrate for 1.5 min to a 405-nm mercury h-line (20 mW/cm$^2$) through a glass/Cr mask with the use of a SUSS MA45 (Karl Suss KG—GmbH & Co., Munich-Garching, Germany) mask aligner. With the mask, the exposure in the swelling layer takes place in the shape according to FIG. 1 (a). Development of the mixture is carried out in one part by volume DMAc and 2 parts by volume propylene carbonate (Sigma-Aldrich Co. LLC, Germany) for 30 s with a subsequent rinsing in isopropyl alcohol. Finally, the layer stack is annealed on the substrate at 200° C. for 5 min under a nitrogen atmosphere in order to remove excess solvents.

The differential strain is achieved in the swelling layer (hydrogel) by swelling in an aqueous medium. The swelling of the swelling layer is carried out after the entire layer stack has been applied. During the swelling, the sacrificial layer is thus completely removed, and the rolled-up layer stack is therefore detached from the substrate. The state of the adhesive layer remains unchanged.

iii) As a stator layer, a polyimide layer is applied on the swelling layer (FIG. 1 (b)). The photosensitive polyimide is produced by the reaction of 3,3',4,4'-benzophenonetetracarboxylic dianhydride (BPDA) and 3,3'-diaminodiphenyl sulfone (DADPS) in N,N-dimethylacetamide (DMAc), photosensitized with (dimethylamino)ethyl methacrylate (DMAEMA) and with 2 wt % 2-benzyl-2-(dimethylamino)-4'-morpholinobutyrophenone (Sigma-Aldrich Co. LLC, Germany). The polyimide synthesis was carried out by dissolving 9.93 g DADPS in 20 ml DMAc with a subsequent addition of 12.8 g BPDA. After the mixture was stirred for 12 h at 70° C., the solution of polyamide acid (PAA) in DMAc was achieved. The solution of PAA is neutralized by a reaction with 12.5 g DMAEMA. Using spin coating, the polyimide was applied to the swelling layer in a rectangular shape across the entire surface as a second carrier layer at 2000-8000 rpm for 35 s. A polyimide layer with a thickness of 1700-500 nm is created. After the drying of the polyimide layer, exposure occurs through a glass/Cr mask in the shape according to FIG. 1 (b), wherein at 60° C. for 5 min, the sample is exposed for 1.5 min to a 405-nm mercury h-line (20 mW/cm$^2$) with the use of a SUSS MA45 (Karl Suss KG—GmbH & Co., Munich-Garching, Germany) mask aligner for structuring. Development takes place in a mixture of one part by volume 1-ethyl-2-pyrrolidone, 0.58 parts by volume methyl alcohol and 0.5 parts by volume diethylene glycol monoethyl ether for 1 min with a subsequent rinsing in propylene glycol monomethyl ether acetate (Sigma-Aldrich Co. LLC, Germany).

The imidization of the polyimide layer is carried out by simultaneously removing the excess solvents on a hot plate at 220° C. for 5 min under a nitrogen atmosphere.

On the layer stack that forms the stator after the rolling-up, the layer stack for the rotor is then applied.

For this purpose, a layer of acrylic acid (AA) (Alfa Aesar) and hydrated La$^{3+}$ (Alfa Aesar) is first applied as a sacrificial layer for the rotor layer stack (FIG. 2 (a)) over the entire surface in the same sequence. The composition and production take place according to the specifications in i). A polymeric swelling layer is then applied according to the composition and production specified in ii) for the layer stack of the rotor. The application of the polyimide layer then also occurs according to iii) and FIG. 1 (e) as a rotor layer.

Then, by means of a selective etching of the sacrificial layer and a swelling of the swelling layer in a solution of 0.5 M sodium diethylenetriaminepentaacetate (DTPA) (Alfa Aesar, UK), the previously planar 2D layout of the layer stack for the rotor is first rolled up (FIG. 2 (b)).

Through an additional selective etching of the sacrificial layer and swelling of the swelling layer in a solution of 0.5 M sodium diethylenetriaminepentaacetate (DTPA) (Alfa Aesar, UK), the previously planar 2D layout of the stator is then rolled up into a 3D Swiss roll (self-assembly).

After the etching process, the structures are washed in DI water and then placed in a solution of DI water and isopropyl alcohol at a ratio of 1:5 for 10 min and finally dried under ambient conditions.

During and/or after the application of the layer stacks for the micro motor, for the production of a sensor composed of Ta(2 nm)/[Co(0.6 nm)/Pt(1 nm)]×5/Cu(1.8 nm)/[Co(0.6 nm)/Pt(1 nm)]×5/Co(0.6 nm)/IrMn(5 nm)/Ta(2 nm) a structured layer stack is applied to the polyimide layer next to the layer stack for the micro motor using magnetron sputter deposition in a high-vacuum chamber (base pressure: $4 \times 10^{-7}$ mbar; Ar sputter pressure: $6 \times 10^{'-4}$ bar; deposition rate 0.2 Å/s) in the presence of a homogeneous magnetic field of 40 mT for the creation of the magnetic anisotropy. Together with the layer stack for the micro motor, or afterwards, the layer stack for the sensor is rolled up and can then be transported together with the micro motor onto a different substrate, where it can be functionally positioned.

With the three-dimensional micro motor produced in such a manner, it is for example possible to power pumps for blood or other micro fluids or perform surgery movements on the micrometer scale.

The individual micro device has a small footprint and, compared to a similar device according to the prior art, operates more efficiently, can be more easily produced, and production is more cost-efficient.

EXAMPLE 2

With micro motors produced according to Example 1, 35 motors can be produced simultaneously on a substrate in a single production process over the entire 100×100 mm² substrate. For this purpose, the individual layers can each be structured and produced separately one after another with the respective masks, or using one mask with all 35 shapes.

In the case of separate structuring, different shapes and sizes of the micro motors can also be produced on the substrate.

Provided that the micro motors produced are completely detached from the substrate, additional micro devices according to the invention can be produced on the same substrate.

The invention claimed is:

1. Three-dimensional micro device comprising:
   at least one three-dimensional roll-up-technology-produced device;
   said device comprising all functional and structural components for full functionality,
   at least one functional or structural component comprising an at least partially freely movable element at least partially within a surrounding element and configured and arranged to be rotated at least around one of a plurality of axes of said surrounding element;
   the functional and structural components comprising any of the following:
      motors, generators, sensors, said sensors including magnetic sensors that utilize effects of MR, GMR, TMR and/or Hall effects, spin effects or induction;
      pumps, diodes, capacitors, resistors, piezo devices;
      optical devices, including lenses, waveguides, gratings; and/or
      turbines, transistors and/or actuators, in prosthetic devices, and/or in microfluidics.

2. The three-dimensional micro device according to claim 1, wherein:
   the functional components comprise rotors, stators, windings, electrical and/or electronic elements, electrical contacts.

3. The three-dimensional micro device according to claim 1, wherein:
   the functional and/or structural components are composed entirely or partially of metallic materials including any of the following: copper, gold, and/or magnetic materials, and/or semiconductor materials, and/or polymer materials, and/or insulator materials.

4. The three-dimensional micro device according to claim 3, wherein:
   said magnetic materials comprises ferromagnetic or ferrimagnetic or paramagnetic material including Co, Fe, Nd, Ni, or Co-, Fe-, Nd- or Ni-based alloys, or made of alloys of said materials.

5. The three-dimensional micro device according to claim 1, wherein:
   the device is structurally composed of a planar multilayer system.

6. The three-dimensional micro device according to claim 1, wherein:
   the three-dimensional micro device comprises a motor or generator or sensor or actuator and includes at least one rotor and one stator, the rotor being freely movable within the stator; and
   said at least one three-dimensional roll-up-technology-produced device, as a motor or generator, has all functional and structural components for complete functionality.

7. The three-dimensional micro device according to claim 1, wherein:
   the device is fixed on a substrate, said substrate being a substrate used in the roll-up-technology production.

8. The three-dimensional micro device according to claim 1, wherein:
   the device has at least one outer dimension less than or equal to 0.5 mm.

9. The three-dimensional micro device according to claim 1, wherein:
   the device has at least one outer dimension less than or equal to 0.1 mm.

10. The three-dimensional micro device according to claim 1, wherein:
    the device has at least one outer dimension on the sub-micrometer scale less than or equal to 200 μm.

11. The three-dimensional micro device according to claim 1, wherein:
    the device has at least one outer dimension on the sub-micrometer scale less than or equal to 1 μm.

12. Three-dimensional micro device comprising:
    at least one three-dimensional roll-up-technology-produced device;
    said device comprising a plurality of components;
    at least one of said components comprising an at least partially freely movable element at least partially within a surrounding element and configured and arranged to be rotated at least around one of a plurality of axes of said surrounding element;
    the plurality of components comprising any components that utilize effects of MR, GMR, TMR and/or Hall effects, spin effects or induction.

13. The three-dimensional micro device according to claim 12, wherein:
    the components comprise rotors and stators.

14. The three-dimensional micro device according to claim 12, wherein:
the plurality of components are composed entirely or partially of metallic materials including any of the following: copper, gold, and/or magnetic materials, and/or semiconductor materials, and/or polymer materials, and/or insulator materials.

15. The three-dimensional micro device according to claim 12, wherein:
the device is structurally composed of a planar multilayer system.

16. The three-dimensional micro device according to claim 12, wherein:
the three-dimensional micro device comprises at least one rotor and one stator, the rotor being freely movable within the stator.

17. The three-dimensional micro device according to claim 12, wherein:
the three-dimensional micro device is fixed on a substrate, said substrate being a substrate used in the roll-up-technology production.

18. The three-dimensional micro device according to claim 12, wherein:
the three-dimensional micro device has at least one outer dimension less than or equal to 0.5 mm.

19. The three-dimensional micro device according to claim 12, wherein:
the three-dimensional micro device has at least one outer dimension less than or equal to 0.1 mm.

20. The three-dimensional micro device according to claim 12, wherein:
the three-dimensional micro device has at least one outer dimension on the sub-micrometer scale less than or equal to 200 µm.

21. The three-dimensional micro device according to claim 12, wherein:
the three-dimensional micro device has at least one outer dimension on the sub-micrometer scale less than or equal to 1 µm.

* * * * *